United States Patent
Kim

(10) Patent No.: US 7,235,450 B2
(45) Date of Patent: Jun. 26, 2007

(54) METHODS FOR FABRICATING SEMICONDUCTOR DEVICES

(75) Inventor: Hag Dong Kim, Suwon-si (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 0 days.

(21) Appl. No.: 11/010,157

(22) Filed: Dec. 10, 2004

(65) Prior Publication Data

US 2005/0130381 A1    Jun. 16, 2005

(30) Foreign Application Priority Data

Dec. 10, 2003    (KR) ..................... 10-2003-0089405

(51) Int. Cl.
*H01L 21/336* (2006.01)

(52) U.S. Cl. ................. 438/301; 438/305; 438/306; 438/527; 438/530

(58) Field of Classification Search ................ 438/301, 438/302, 303, 305, 306, 527, 542, 530
See application file for complete search history.

(56) References Cited

U.S. PATENT DOCUMENTS

| | | | |
|---|---|---|---|
| 6,194,278 B1 | 2/2001 | Rengarajan | |
| 6,362,054 B1 | 3/2002 | Choi et al. | |
| 6,518,136 B2 | 2/2003 | Lee et al. | |
| 6,548,842 B1 * | 4/2003 | Bulucea et al. | ............. 257/288 |
| 6,579,751 B2 | 6/2003 | Tran | |
| 6,589,847 B1 | 7/2003 | Kadosh et al. | |
| 2003/0148564 A1 | 8/2003 | Chang | |

* cited by examiner

*Primary Examiner*—Michael Trinh
(74) *Attorney, Agent, or Firm*—Saliwanchik, Lloyd & Saliwanchik

(57) ABSTRACT

Methods for stabilizing a threshold voltage in an NMOS transistor are disclosed. A disclosed method comprises: forming a gate electrode on an active region in a substrate of a first conductive type; implanting ions of a second conductive type into the active region to form LDD regions; forming spacers on the sidewalls of the gate electrode; implanting ions of the second conductive type into the active region to form second source/drain regions; implanting halo ions into the active region; activating ions in the source/drain regions by conducting a first thermal process; and moving the halo ions toward the surface of the channel under the gate electrode by conducting a second thermal process.

6 Claims, 3 Drawing Sheets

METHODS FOR FABRICATING SEMICONDUCTOR DEVICES

FIELD OF THE DISCLOSURE

The present disclosure relates generally to semiconductor fabrication and, more particularly, to methods for stabilizing a threshold voltage in an NMOS transistor.

BACKGROUND

In general, as the degree of integration in a semiconductor device increases, the sizes of the gate electrodes and the source/drain regions of a MOS transistor in the device decrease accordingly. This miniaturization of the structures of the MOS transistor requires a reduction in the length of a channel of the transistor. However, if the length of the channel in the MOS transistor is reduced below a certain size, undesirable electric characteristics (e.g., short channel effects) may occur.

To prevent these short channel effects from occurring in a MOS transistor, the horizontal length (i.e., the length of the gate electrode) should be decreased as well as the vertical length (i.e., the thickness of the gate insulating layer and the depth of the source/drain region). In addition, a decrease in the voltage of the driving power, an increase in the doping concentration of the substrate, and an efficient control for doping profiles in a channel area should be achieved.

Although the size of semiconductor devices has radically decreased, driving voltages applied to the semiconductor devices are still high. Thus, conventional NMOS transistors inevitably have several vulnerabilities. For example, a large potential gradient in a drain region may rapidly move electrons injected from a source region toward the drain region. Thus, hot carriers are readily generated around the drain region.

In order to enhance the structure of the conventional NMOS transistors generating the hot carriers, a lightly doped drain (hereinafter referred to as "LDD") structure has been introduced.

A low concentration LDD region between a channel and a source/drain region is capable of mitigating the high drain-gate voltage around the drain junctions in the NMOS transistors. Thus, the otherwise large potential gradient in the drain region is decreased, thereby preventing the occurrence of hot carriers in the drain region. Various methods have been provided to fabricate a transistor having the LDD structure. One of the known methods for manufacturing a transistor having the LDD structure is to form spacers of insulating layers on the sidewalls of the gate electrodes.

Recently, as semiconductor devices have become increasingly integrated, a process for forming shallow junctions must be employed to efficiently prevent the short channel effect. The shallow junctions are formed by implanting B+ ions or $BF_2+$ ions with a low implantation energy. However, as very large scale integration in the semiconductor devices is further progressed, the desired profiles of the junctions in the LDD structure are getting more difficult to achieve. Thus, a halo structure is additionally introduced to prevent the depletion areas of the source and drain regions from getting horizontally closer to each other. The halo structure does not affect the doping concentration in a channel area which determines the threshold voltage of the NMOS transistor.

The halo structure is formed by implanting halo ions (i.e., impurities of the opposite type to those of the source/drain region) around the junctions of the source/drain region adjacent to the gate electrodes in the NMOS transistor. Thus, the depletion areas of the source/drain region are reduced by forming diffusion areas which have higher impurity concentration than that of the wells adjacent to the junctions of the source/drain region.

FIG. 1 is a cross-sectional view illustrating a prior art NMOS transistor having a halo structure. Referring to FIG. 1, an active region is defined in a substrate 10 by isolation structures 11 in field regions. A gate insulating layer 13 is formed on the active region of the substrate 10. A gate electrode 20 is then formed on the gate insulating layer 13. Subsequently, N− type LDD regions 30 are formed around the gate electrode 20 in the active region. Halo regions (H) 40 are then formed under the N− type LDD regions 30 in the substrate 10. Subsequently, spacers of insulating layers 50 are formed on the sidewalls of the gate electrode 20. Finally, N+ type source/drain regions 60 are formed in the semiconductor substrate 10 on opposite sides of the gate electrode 20 and the spacers 50.

However, in such conventional NMOS transistors, after the ion implantations for forming the LDD regions 30 and the halo regions H are completed, a rapid thermal process (hereinafter referred to as "RTP") is conducted to activate the impurities (e.g., As ions) in the LDD regions 30. When the impurities in the LDD regions 30 are activated by the RTP, diffusion of the impurities (e.g., boron) in the halo regions H toward the surface of the channel area is suppressed. Therefore, the threshold voltage of the NMOS transistor may be unstable, which detrimentally affects the electric characteristics of the NMOS transistor.

Kadosh et al., U.S. Pat. No. 6,589,847, describes a method of forming halo implant regions in a semiconductor device by performing a first angled implant process using a dopant material that is of a type opposite to a first type of dopant material and performing a second angled implant using a dopant material that is of the same type as the first type of dopant material.

Tran et al., U.S. Pat. No. 6,579,751, describes a method of forming integrated circuitry comprising first and second type MOS transistors.

Lee et al., U.S. Pat. No. 6,518,136, describes a method for making abrupt, PN junctions and haloes which use a mask, e.g., sidewall spacers, during ion implantation of gate, source, and drain regions. Halo regions are implanted and activated by preferably using a spike annealing to prevent their diffusion.

Choi et al., U.S. Pat. No. 6,362,054, describes a method for forming a MOS transistor in a semiconductor substrate at a shallow implant angle by implanting a halo implant.

Rengarajan et al., U.S. Pat. No. 6,194,278, describes a method for forming a halo implant for semiconductor devices including the step of providing a substrate having a gate stack formed thereon.

DETAILED DESCRIPTION

Figure 1:
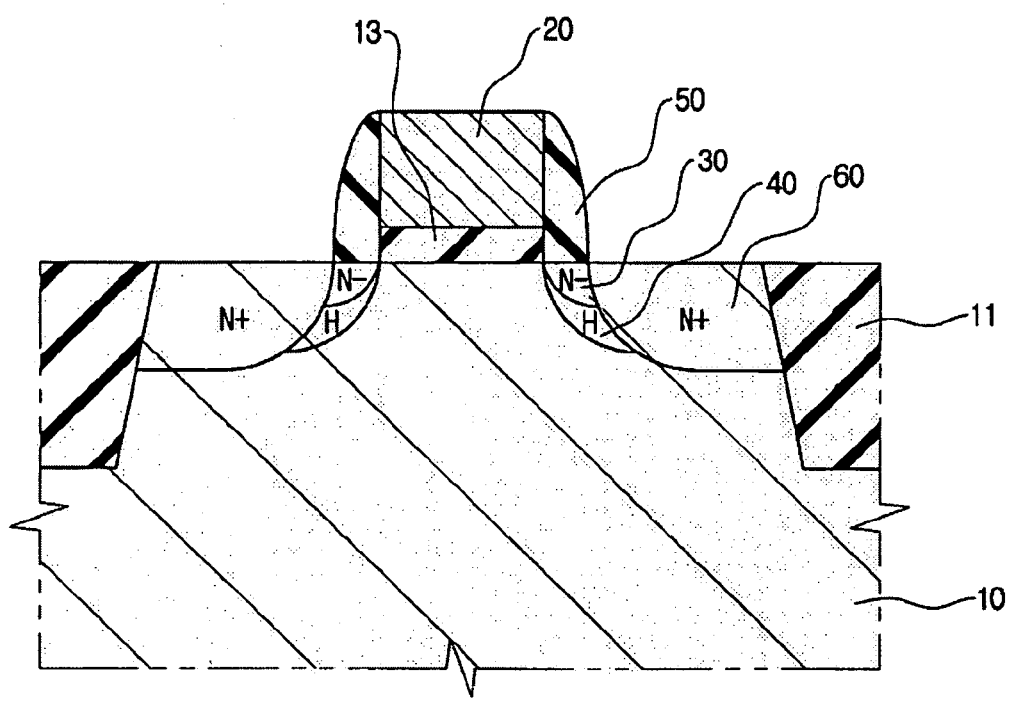
FIG. 1 is a cross-sectional view illustrating a prior art NMOS transistor having a halo structure.
Figure 2A:
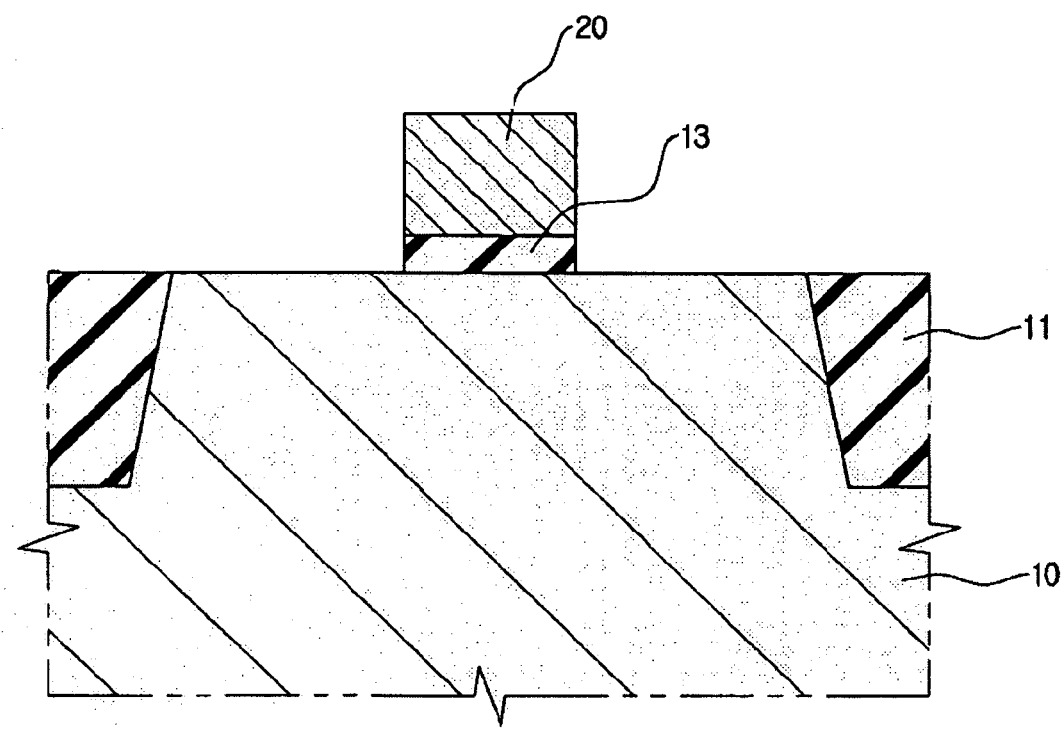
FIGS. 2a through 2e are cross-sectional views illustrating an example method for manufacturing a semiconductor device performed in accordance with the teachings of the present invention.

FIGS. 2a through 2e are cross-sectional views illustrating an example method for manufacturing a semiconductor device performed in accordance with the teachings of the present invention. Referring to FIG. 2a, isolation structures 11 are formed to electrically insulate active regions of a substrate 10. The isolation structures 11 are made of insulating layers such as oxide layers which are formed in field areas in the substrate 10 through an isolation process (e.g., an STI (Shallow Trench Isolation) formation process). The substrate 10 of the illustrated example is made of single crystal silicon. This silicon may be either an N-type or a P-type conductive material. In the following example, the substrate is made of a P-type conductive material.

At this stage, additional ion implantations (not shown) for different purposes (e.g., controlling the threshold voltage, preventing punch through, forming a channel stopper, and/or forming a well) can be performed. A P-type impurity (e.g., boron ions) is mainly used in such ion implantations.

Subsequently, a gate insulating layer 13 is grown on the active region of the substrate 10, to a thickness ranging between about 100 Å and 150 Å through a thermal oxidation process. Subsequently, a conductive layer for forming a gate electrode 20 is deposited by a CVD (Chemical Vapor Deposition) process (e.g., a LPCVD (Low Pressure CVD) process). In the illustrated example, the conductive layer is made of multi-crystal silicon with a thickness ranging between about 1500 Å and 3000 Å. A silicide layer (not shown) may be formed on the multi-crystal silicon layer. The multi-crystal silicon layer is then doped with highly concentrated impurities to make the gate electrode 20.

Subsequently, a pattern mask (not shown) for the gate electrode 20, such as a photoresist pattern, is formed on the multi-crystal silicon layer through a well known photolithography process. The portions of the multi-crystal silicon layer and the gate oxide layer 13 which are not under the pattern mask are then removed. The pattern mask is then removed.

Figure 2B:
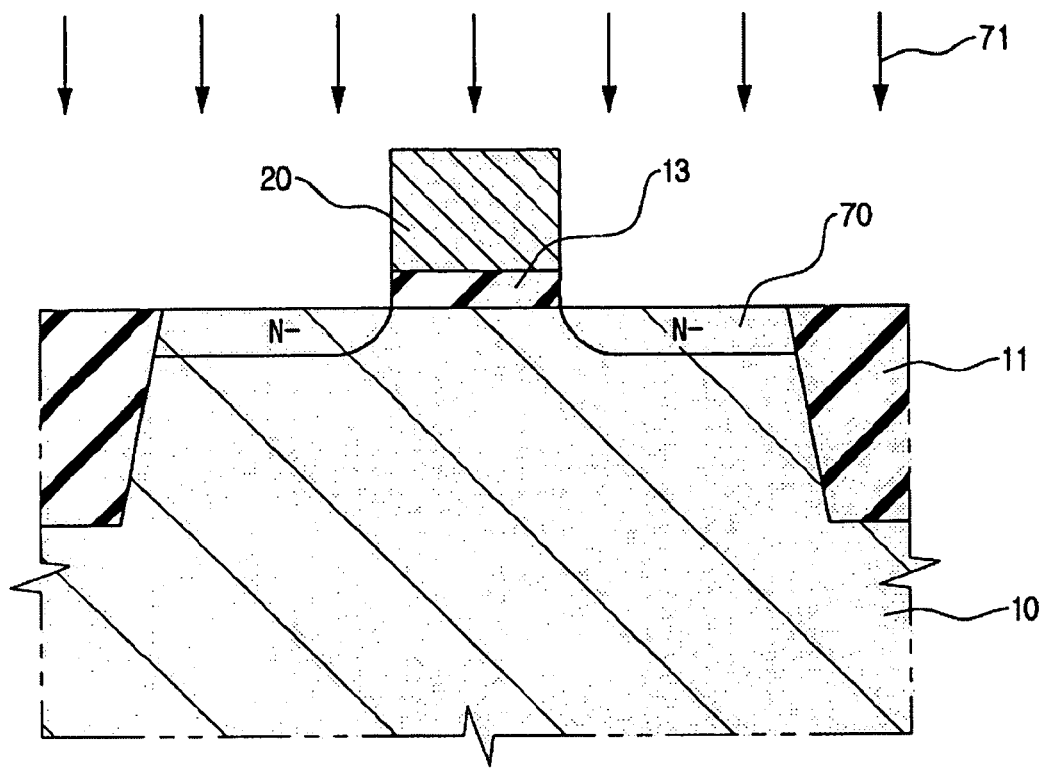

Referring to FIG. 2b, impurities of the second conductive type, (e.g., N-type impurities such as As ions) are implanted into the active area at a low concentration. During this implantation process, the gate electrode pattern is used as an ion implantation mask. Subsequently, N-type LDD regions 70 are completed by diffusing N-type impurities 71 through a thermal process (e.g., RTP). Preferably, the thermal process is performed in an inert gas atmosphere such as an $N_2$ atmosphere at a temperature ranging between about 900° C. and about 1050° C. for about 10 seconds to about 20 seconds.

Figure 2C:
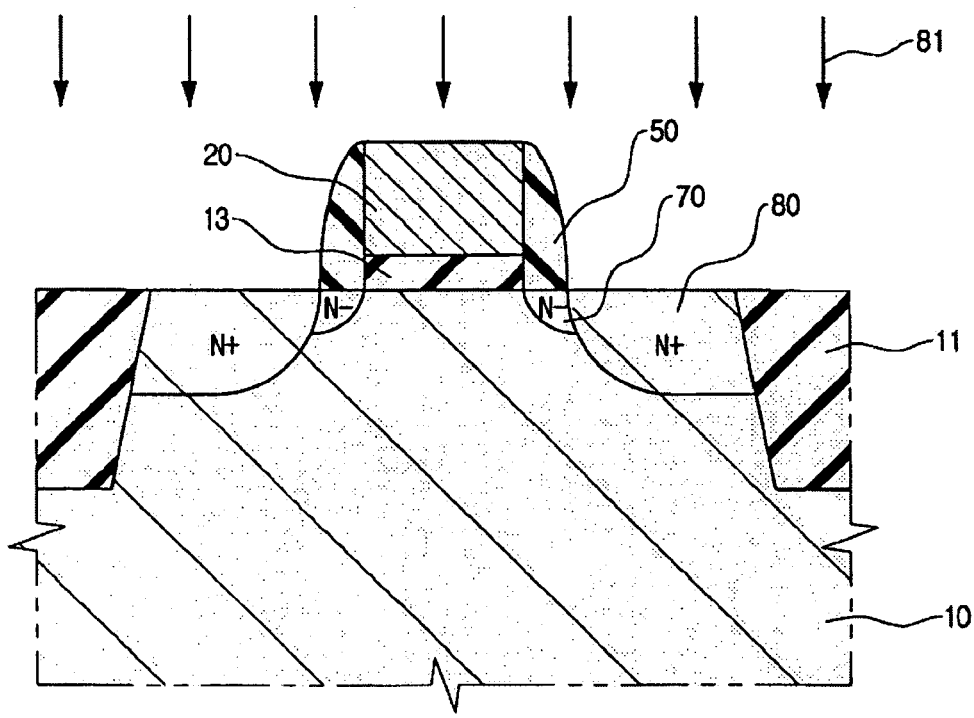
Figure 2D:
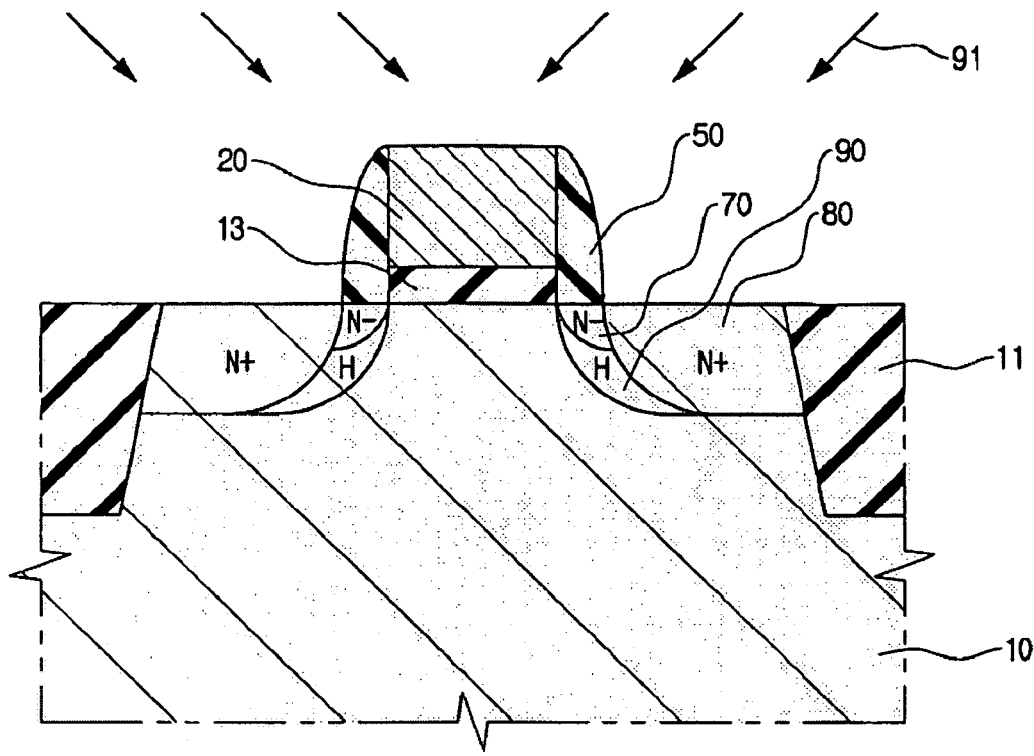
Figure 2E:
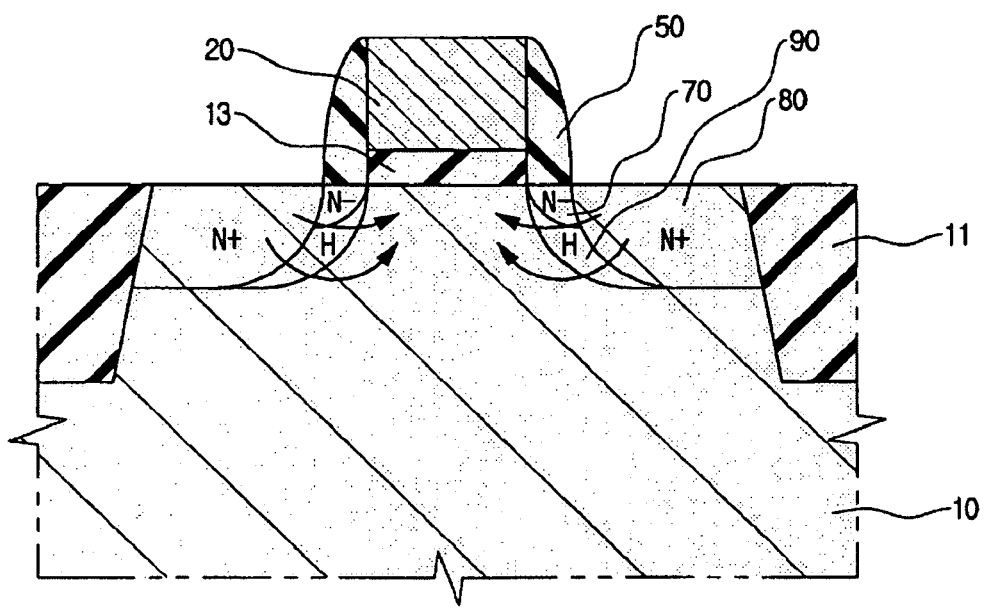

Referring to FIG. 2c, an insulating layer for making spacers 50 is then deposited on the entire area of the resulting structure by a CVD process. Subsequently, the spacers 50 are formed on the sidewalls of the gate electrode 20 by an anisotropic etching. The active regions of the substrate 10 around the spacers 50 are exposed by the etching process.

Subsequently, N-type impurities 81 such as As ions are implanted into the active regions of the substrate 10 by using the gate electrode 20 and the spacers 50 as a mask. Preferably, the As ions 81 are implanted at an ion implantation energy ranging between about 30 keV and about 100 keV with an ion concentration ranging between about 1E15 ions/cm$^2$ and about 5E15 ions/cm$^2$ Referring to FIG. 2d, halo ions 91 such as, boron ions for forming halo regions are implanted at a predetermined angle, a predetermined ion implantation energy and a predetermined ion implantation concentration. Preferably, the angle is about 30°, the ion implantation energy is between about 30 keV and about 100 keV, and the ion implantation energy is about 1E13 ions/cm$^2$ and about 5E14 ions/cm$^2$ Referring to FIG. 2e, a first thermal process such as RTP is performed in an $N_2$ atmosphere at a temperature ranging between about 900° C. and about 1050° C. for about 10 seconds to about 60 seconds. The first thermal process activates the As ions implanted in the active regions, thereby forming junctions between the halo regions and the source/drain regions. Here, the diffusion of the halo ions 91 such as boron ion shown in FIG. 2d toward the surface of the channel area under the electrode 20 is suppressed.

Subsequently, a second thermal process is performed in an $N_2$ atmosphere by using a furnace at a temperature ranging between 600° C.~800° C. for about 30 minutes to about 120 minutes. The second thermal process deactivates the As ions in the source/drain regions 80, thereby resulting in various defects, such as interstitial sites, in the source/drain regions 80. Thus, the boron ions implanted into the substrate 10 as well as the ions in the halo regions 90 are dynamically diffused. The boron ions are moved toward the surface under the gate electrode 20 as shown by the arrows in FIG. 2e.

Although not shown in the figures, several conventional processes such as a silicide formation process, a contact process, and a metallic interconnect process are later performed to complete the fabrication process.

In view of the foregoing, persons of ordinary skill in the art will appreciate that the disclosed methods and apparatus are capable of minimizing the occurrence of and reversing short channel effects, stabilizing the threshold voltage, and enhancing electric characteristics such as current leakage by increasing the boron ion concentration.

It is noted that this patent claims priority from Korean Patent Application Serial Number 10-2003-89405, which was filed on Dec. 10, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a semiconductor device comprising:
   forming a gate electrode on an active region of a substrate of a first conductive type;
   implanting ions of a second conductive type into the active region to form LDD regions;
   forming spacers on sidewalls of the gate electrode;
   implanting ions of the second conductive type into the active region to form source/drain regions;
   implanting halo ions into the active region;
   activating ions in the source/drain regions, forming junctions between halo ion regions and the source/drain regions, and suppressing the diffusion of the halo ions toward the surface of the channel area under the gate electrode by performing a first thermal process; and
   deactivating the implanted ions in the source/drain region, forming defects in the source/drain regions from the deactivating of the implanted ions, diffusing the ions implanted into the substrate and the halo ions implanted into the halo regions by the forming of the defects, and moving the halo ions by the forming of the defects toward the surface of the channel under the gate electrode by performing a second thermal process,
   wherein the second thermal process is performed in an $N_2$ atmosphere at a temperature ranging between 600° C.~800° C.

2. The method as defined in claim 1, wherein the first thermal process is a rapid thermal process.

3. The method as defined in claim 1, wherein the first thermal process is performed in an $N_2$ atmosphere at a temperature ranging between about 900° C. and about 1050° C. for about 10 seconds to about 60 seconds.

4. The method as defined in claim 1, wherein the second thermal process is performed using a furnace.

5. The method as defined in claim 1, wherein the second thermal process is performed for about 30 minutes to about 120 minutes.

6. The method as defined in claim 1, wherein the halo ions are boron ions.

* * * * *